United States Patent
Liu et al.

(10) Patent No.: US 10,132,901 B2
(45) Date of Patent: Nov. 20, 2018

(54) DIFFUSION MODEL DATA ACQUISITION METHOD FOR MAGNETIC RESONANCE IMAGING SYSTEM, AND MAGNETIC RESONANCE IMAGING METHOD

(71) Applicant: Siemens Healthcare GmbH, Erlangen (DE)

(72) Inventors: Hui Liu, Shanghai (CN); Xu Yan, Shanghai (CN)

(73) Assignee: Siemens Healthcare GmbH, Erlangen (DE)

( * ) Notice: Subject to any disclaimer, the term of this patent is extended or adjusted under 35 U.S.C. 154(b) by 310 days.

(21) Appl. No.: 14/983,681

(22) Filed: Dec. 30, 2015

(65) Prior Publication Data
US 2016/0187443 A1 Jun. 30, 2016

(30) Foreign Application Priority Data
Dec. 30, 2014 (CN) .......................... 2014 1 0843666

(51) Int. Cl.
*G01R 33/56* (2006.01)
*G01R 33/54* (2006.01)
*G01R 33/563* (2006.01)

(52) U.S. Cl.
CPC ...... *G01R 33/56341* (2013.01); *G01R 33/543* (2013.01)

(58) Field of Classification Search
CPC .................. G01R 33/543; G01R 33/56341
See application file for complete search history.

(56) References Cited

U.S. PATENT DOCUMENTS

| 7,057,388 B2 | 6/2006 | Harvey et al. |
| 2011/0074416 A1 | 3/2011 | Yamashita et al. |
| 2015/0253410 A1* | 9/2015 | Warfield ............... A61B 5/055 324/309 |

FOREIGN PATENT DOCUMENTS

| CN | 102008308 A | 4/2011 |
| CN | 102590773 A | 7/2012 |
| WO | WO-2007046172 A1 | 4/2007 |

OTHER PUBLICATIONS

Kunz, Nicolas, et al. "Assessing white matter microstructure of the newborn with multi-shell diffusion MRI and biophysical compartment models." Neuroimage 96 (2014): 288-299.*

* cited by examiner

*Primary Examiner* — Rishi Patel
(74) *Attorney, Agent, or Firm* — Schiff Hardin LLP

(57) ABSTRACT

In a method for acquiring MR diffusion data, in a control computer of an MRI system, multiple individual data sets, respectively corresponding to multiple diffusion models, are defined and combined to form a combined data set. Each of said individual data sets is comprised of multiple diffusion image individual data subsets that are to be acquired on one or more specific shells, respectively, and in one or more gradient directions, respectively. Different specific shells among the multiple shells have different diffusion factors. The control computer then operates the MRI system, namely the data acquisition scanner thereof, in order to acquire MR data corresponding to the defined combined data set.

5 Claims, 1 Drawing Sheet

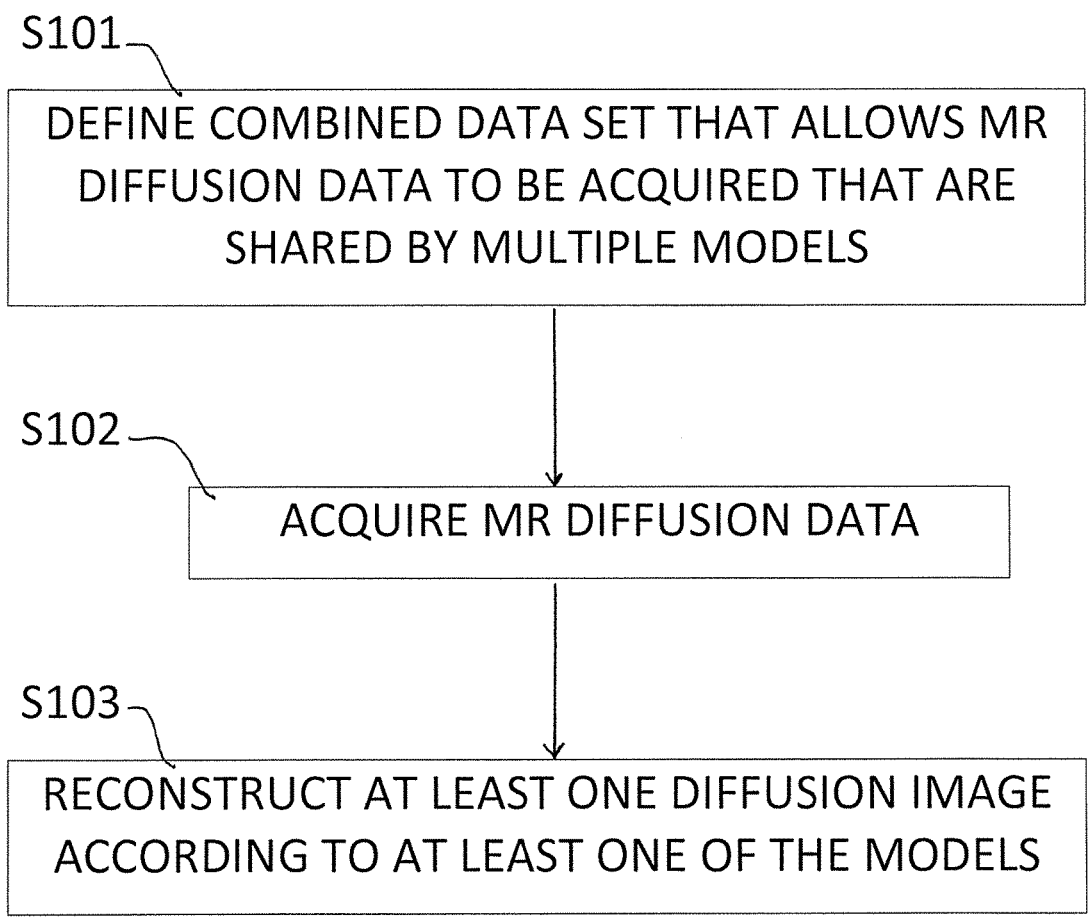

DIFFUSION MODEL DATA ACQUISITION METHOD FOR MAGNETIC RESONANCE IMAGING SYSTEM, AND MAGNETIC RESONANCE IMAGING METHOD

BACKGROUND OF THE INVENTION

Field of the Invention

The present invention relates to the technical field of magnetic resonance imaging, and a diffusion model data acquisition method for a magnetic resonance imaging system.

Description of the Prior Art

Magnetic resonance imaging (MRI) is a technology in which the phenomenon of magnetic resonance is utilized for the purpose of imaging. The basic principles of magnetic resonance are as follows: when an atomic nucleus contains a single proton, as is the case with the nuclei of the hydrogen atoms that are present throughout the human body, this proton exhibits spin motion and resembles a small magnet. The spin axes of these small magnets lack an adhesive pattern, but when an external magnetic field is applied, the small magnets will be rearranged according to the magnetic force lines of the external magnetic field. Specifically, they will align in two directions, either parallel or anti-parallel to the magnetic force lines of the external magnetic field. The direction parallel to the magnetic force lines of the external magnetic field is called the positive longitudinal axis, while the direction anti-parallel to the magnetic force lines of the external magnetic field is called the negative longitudinal axis. The atomic nuclei only have a longitudinal magnetization component, which has both a direction and a magnitude. A radio frequency (RF) pulse of a specific frequency is used to excite the atomic nuclei in the external magnetic field such that their spin axes deviate from the positive longitudinal axis or negative longitudinal axis, giving rise to resonance—this is the phenomenon of magnetic resonance. Once the spin axes of the excited atomic nuclei have deviated from the positive or negative longitudinal axis the atomic nuclei have a transverse magnetization component.

Once emission of the RF pulse has ended, the excited atomic nuclei emit an echo signal, gradually releasing the absorbed energy in the form of electromagnetic waves, such that their phase and energy level both return to the pre-excitation state. An image can be reconstructed by subjecting the echo signal emitted by atomic nuclei to further processing, such as spatial encoding.

Diffusion imaging is a commonly used MRI method, which makes use of various diffusion models to obtain information about different microscopic structures contained in diffusion signals. There is some variation in the data acquisition methods required for different diffusion models, therefore a longer acquisition time is needed to acquire the data of the various models.

SUMMARY OF THE INVENTION

An object of the present invention is to provide a diffusion model data acquisition method for an MRI system that allows multiple diffusion models to share combined data.

In the method according to the invention, in a control computer of an MRI system, multiple individual data sets, respectively corresponding to multiple diffusion models, are defined and combined to form a combined data set. Each of said individual data sets is comprised of multiple diffusion image individual data subsets that are to be acquired on one or more specific shells, respectively, and in one or more gradient directions, respectively. Different specific shells among the multiple shells have different diffusion factors. The control computer then operates the MRI system, namely the data acquisition scanner thereof, in order to acquire MR data corresponding to the defined combined data set.

Preferably, the combined data set is defined by combining a number of the diffusion image individual data subsets that are to be acquired on an identical shell in each of the individual data sets to form a number of first diffusion image combined data subsets acquired on the identical shell in the combined data set, with the number of the first diffusion image combined data being greater than or equal to the maximum value of respective numbers of diffusion image individual data subsets acquired on the identical shell in each of the individual data sets, and the specific shell forming said identical shell.

Preferably, the combined data set is further defined by combining a number of the diffusion image individual data subsets to be acquired on a number of adjacent shells in a number of the individual data sets to form a number of second diffusion image combined data subsets to be acquired on a normalized shell in the combined data set. The number of second diffusion image combined data subsets is greater than or equal to the maximum value of numbers of the diffusion image individual data subsets acquired on the adjacent shells in each of the individual data sets, the specific shell including the adjacent shells.

Preferably, the mathematical difference of the diffusion factors of any two of the adjacent shells is less than or equal to a first threshold, or the mathematical difference between a maximum value and a minimum value of the diffusion factors of adjacent shells is less than or equal to a second threshold.

Preferably, the diffusion factor of the normalized shell is one of, or the mean, or the median, of the diffusion factors of a number of the adjacent shells.

Preferably, the MR data are acquired according to the defined combined data set using a number of the gradient directions that are uniformly distributed to acquire a number of subsets diffusion image individual data on a specific shell in the combined data set.

The present invention also encompasses an MRI method, wherein the MR data file for the combined data set is acquired as described above and is provided to an image reconstruction computer wherein one or more reconstruction algorithms is executed to reconstruct one or more diffusion images according to one or more of the multiple diffusion models.

With the diffusion model data acquisition method for an MRI system according to the present invention, a number of diffusion models can effectively share combined data, and the acquisition time can be significantly shortened to facilitate clinical application.

BRIEF DESCRIPTION OF THE DRAWINGS

The single FIGURE is a flowchart of the diffusion model data acquisition method for an MRI system according an embodiment of the invention, with a reconstruction step also included.

DESCRIPTION OF THE PREFERRED EMBODIMENTS

The present invention is explained below by the use of particular embodiments, to present the object, technical solution and advantages thereof.

In the nervous system, diffusion signals may be modeled by various methods. Different diffusion models provide specific information, but need different data acquisition methods. The diffusion effect involves Brownian motion of water molecules, i.e. random motion of water molecules; the degree of diffusion of water molecules is expressed by a diffusion factor, with different shells having different diffusion factors. The diffusion factor is generally expressed as a b-value, with the size of the b-value depending on the diffusion gradient application waveform. The greater the b-value vector, the greater the signal attenuation caused by the water molecule diffusion effect will be. At the same time, the b-value also has directionality, which depends on the direction in which the diffusion gradient is applied, and can reflect the water molecule diffusion effect in the direction corresponding to the b-value. Some of the more well-known diffusion models are presented below:

Diffusion tensor imaging (DTI): a traditional and the most widely used nervous system diffusion model, this generally needs to acquire diffusion weighted data with a non-zero b-value (generally 1000 s/mm$^2$) in multiple diffusion gradient directions (>6), and can then obtain by calculation a series of parameter images, such as the fractional anisotropy parameter (FA) and mean diffusivity parameter (MD). This model may also be used to display the geometric structure of nerve fiber bundles; this is called fiber bundle tracking technology.

Diffusion kurtosis imaging (DKI): a diffusion model used to describe a non-Gaussian diffusion phenomenon. This model needs to acquire diffusion data of multiple shells (at least two shells), the maximum b-value is in the range 2000-3000 s/mm$^2$, moreover at least 15 diffusion gradient directions are applied for each shell, and the gradient directions of each shell generally have the same uniform distribution.

Neurite orientation dispersity and density imaging (NODDI): a diffusion model for providing information about brain microscopic structure, including axon density and axon orientation dispersity. The best acquisition scheme thereof comprises two shells; diffusion and the number and direction settings of diffusion gradients are different between different shells. The use of different gradient directions can increase angle differentiating power; the use of a higher gradient direction density at a higher b-value shell enables more accurate detection of complex nerve structures.

Intravoxel incoherent motion (IVIM): used to quantitatively assess molecular diffusion of water and microcirculation of blood in a capillary network. This model acquires diffusion data for multiple b-values, especially ultra-low b-values (b<200 s/mm$^2$), but it generally does not have high requirements in terms of the number of gradient directions.

High angular resolution diffusion imaging (HARDI): used for nerve fiber bundle imaging, and can solve the problem of nerve fiber bundle crossover. This model generally needs single-shell diffusion data in more than 40 gradient directions.

The above methods reflect microscopic structure information about nerve systems from different perspectives, therefore in clinical research, a combination of different diffusion models is needed to facilitate comprehensive analysis. However, these methods have different modes of acquisition (see table 1), and a longer acquisition time is needed to acquire data of the various models; this is inadequate for clinical research. Since data can be partially or completely shared among different models, designing a comprehensive acquisition scheme for these models will significantly shorten the total acquisition time.

TABLE 1

| Model | Mode of acquisition | Acquisition time (average for one acquisition) |
| --- | --- | --- |
| DTI | b = 0, 1000 (30 gradient directions) | ~3 minutes |
| DKI | b = 0, 1000 (30 gradient directions), 2000 (30 gradient directions) | ~6 minutes |
| NODDI | b = 0, 700 (21 gradient directions), 2000 (42 gradient directions) | ~6 minutes |
| IVIM | multiple b-values in the range 0-1000 (3 gradient directions) | ~2 minutes |
| HARDI | b = 0, 2000 (64 gradient directions) | ~6 minutes |
| Total time | | ~21 minutes |

In order to effectively acquire data for multiple diffusion models, the present invention provides a diffusion model data acquisition method for an MRI system.

In the method according to the invention, in step S101 performed in a control computer of an MRI system, multiple individual data sets, respectively corresponding to multiple diffusion models, are defined and combined to form a combined data set. Each of said individual data sets is comprised of multiple diffusion image individual data subsets that are to be acquired on one or more specific shells, respectively, and in one or more gradient directions, respectively. Different specific shells among the multiple shells have different diffusion factors. In step S102, the control computer then operates the MRI system, namely the data acquisition scanner thereof, in order to acquire MR data corresponding to the defined combined data set. The acquired MR data are made available from the control computer as an MR data file.

In step S103, the MR data file for the combined data set is acquired as described above and is provided to an image reconstruction computer wherein one or more reconstruction algorithms is executed to reconstruct one or more diffusion images according to one or more of the multiple diffusion models.

Thus, different diffusion models share a combined data set; even in the case where the same data is acquired multiple times, the overall acquisition time is significantly shortened because sequence scanning time is saved. At the same time, reconstruction accuracy will be somewhat improved or at least equivalent to that in the case of individual data sets; this is because the present invention, by combining data, provides a higher level of data redundancy for the various diffusion models.

Preferably, the combined data set is defined by combining a number of the diffusion image individual data subsets that are to be acquired on an identical shell in each of the individual data sets to form a number of first diffusion image combined data subsets acquired on the identical shell in the combined data set, with the number of the first diffusion image combined data being greater than or equal to the maximum value of respective numbers of diffusion image individual data subsets acquired on the identical shell in each of the individual data sets, and the specific shell forming said identical shell.

For example, DTI, DKI and IVIM all need magnetic resonance diffusion image individual data on a shell for which the b-value is 1000 s/mm$^2$; DTI and DKI each need 30, whereas IVIM needs 3, therefore 30 diffusion image individual data can be acquired on a shell for which the b-value is 1000 s/mm$^2$, to be shared by the three models DTI, DKI and IVIM.

Preferably, the combined data set is further defined by combining a number of the diffusion image individual data subsets to be acquired on a number of adjacent shells in a number of the individual data sets to form a number of second diffusion image combined data subsets to be acquired on a normalized shell in the combined data set. The number of second diffusion image combined data subsets is greater than or equal to the maximum value of numbers of the diffusion image individual data subsets acquired on the adjacent shells in each of the individual data sets, the specific shell including the adjacent shells.

For example, NODDI needs 21 magnetic resonance diffusion image individual data on a shell for which the b-value is 700 s/mm$^2$; DTI, DKI and IVIM all need magnetic resonance diffusion image individual data on a shell for which the b-value is 1000 s/mm$^2$, DTI and DKI each needing 30, and IVIM needing 3. Therefore 30 magnetic resonance diffusion image individual data can be acquired on a shell for which the b-value is 1000 s/mm$^2$, to be shared by the four models NODDI, DTI, DKI and IVIM; the median of the diffusion factors of the four diffusion models is 1000 s/mm$^2$, and the difference in diffusion factors is 300 s/mm$^2$. The difference in the diffusion factors of any two of a plurality of said adjacent shells is less than or equal to a first threshold, or the difference between a maximum value and a minimum value of said diffusion factors in a plurality of said adjacent shells is less than or equal to a second threshold. Thus, the diffusion model data acquisition method for an MRI system according to a particular embodiment of the present invention sets a normalizable number of adjacent shells to be within a rational range, and a user can set this rational range as required to make the diffusion model data acquisition method for an MRI system according to a particular embodiment of the present invention more flexible and effective.

The diffusion factor of the normalized shell is the mean or the median or one of said diffusion factors of a number of said adjacent shells. Thus, the diffusion model data acquisition method for an MRI system according to an embodiment of the present invention sets a diffusion factor of a normalized shell to be more rational, and a user can set this diffusion factor as required (for example, the mean is used if diffusion factors of a number of adjacent shells are relatively concentrated, the median is used if they are relatively scattered, and if a particular adjacent shell is relatively critical then one of them is used), to make the diffusion model data acquisition method for an MRI system according to a particular embodiment of the present invention more flexible and effective.

The acquisition of the MR data is implemented along a number of the gradient directions that are uniformly distributed, so as to acquire a number of magnetic resonance diffusion image individual data subsets on a specific shell in the combined data set. For each specific shell, a number of gradient directions are set to be uniformly distributed; even if one diffusion model only uses magnetic resonance diffusion image data of some of the gradient directions, the beneficial effect of maximized degree of differentiation can still be attained.

The diffusion model data acquisition method for an MRI system according to the present invention can restrict data acquisition to a limited number of shells, each shell being able to contain a large number of gradient directions, and therefore provides structural information of high angular resolution for microscopic biological structures; at the same time, these data easily satisfy the requirements of models which demand high angular resolution. At the same time, the specific requirements of each diffusion model with regard to gradient settings can be combined more effectively, with the degree of angular differentiation of diffusion directions being maximized. In summary, when the diffusion model data acquisition method for an MRI system according to a particular embodiment of the present invention is used, a plurality of diffusion models can effectively share combined data, and the acquisition time can be significantly shortened to facilitate clinical application.

Although modifications and changes may be suggested by those skilled in the art, it is the intention of the inventors to embody within the patent warranted hereon all changes and modifications as reasonably and properly come within the scope of their contribution to the art.

We claim as our invention:

1. A method for acquiring magnetic resonance (MR) data, comprising:

in a control computer of an MR imaging system, defining multiple individual data sets, respectively corresponding to multiple diffusion models, with each of said individual data sets being comprised of multiple diffusion image individual data subsets that are to be acquired on one or more specific shells, respectively, and in one or more gradient directions, respectively, and with different specific shells among the multiple shells having different diffusion factors;

defining the combined data set by combining a number of the diffusion image individual data subsets to be acquired on a number of adjacent shells in a number of the individual data sets to form a number of second diffusion image combined data subsets to be acquired on a normalized shell in the combined data set, with the number of second diffusion image combined data subsets is greater than or equal to the maximum value of numbers of the diffusion image individual data subsets acquired on the adjacent shells in each of the individual data sets, the specific shell including the adjacent shells; and from the control computer, operating a data acquisition scanner of the MR imaging system in order to acquire MR data corresponding to the defined combined data set, and making the acquired MR data available in electronic form from the control computer as an MR data file.

2. The method as claimed in claim 1, wherein the difference in said diffusion factors of any two of a plurality of said adjacent shells is less than or equal to a first threshold, or the difference between a maximum value and a minimum value of said diffusion factors in a plurality of said adjacent shells is less than or equal to a second threshold.

3. The method as claimed in claim 1, wherein said diffusion factor of said normalized shell is one of the mean or the median of said diffusion factors of a plurality of said adjacent shells.

4. The method as claimed in claim 1, wherein said acquisition step comprises: using a plurality of said gradient directions which are uniformly distributed to acquire a plurality of diffusion image individual data on a specific shell in said combined data set.

5. The method as claimed in claim 1, comprising, in a reconstruction computer, reconstructing at least one diffusion image from data in the MR data file according to at least one of the diffusion models, and making the reconstructed diffusion image available in electronic from the reconstruction computer as an image data file.

* * * * *